United States Patent [19]

Luryi

[11] Patent Number: 5,146,078
[45] Date of Patent: Sep. 8, 1992

[54] ARTICLES AND SYSTEMS COMPRISING OPTICALLY COMMUNICATING LOGIC ELEMENTS INCLUDING AN ELECTRO-OPTICAL LOGIC ELEMENT

[75] Inventor: Sergey Luryi, Bridgewater, N.J.

[73] Assignee: AT&T Bell Laboratories, Murray Hill, N.J.

[21] Appl. No.: 639,634

[22] Filed: Jan. 10, 1991

[51] Int. Cl.[5] ........................ H01J 31/50; H01J 40/14
[52] U.S. Cl. ................................ 250/213 A; 250/551; 377/102
[58] Field of Search ............ 250/213 A, 551; 357/17, 357/19, 40; 359/126–128; 377/102

[56] References Cited

U.S. PATENT DOCUMENTS

| | | | |
|---|---|---|---|
| 3,401,266 | 9/1968 | Cooke-Yarborough | 250/213 A |
| 3,655,988 | 4/1972 | Nakamura et al. | 250/213 A |
| 3,818,451 | 6/1974 | Coleman | 250/551 |
| 3,947,842 | 3/1976 | Hilsum et al. | 250/213 A |
| 4,533,833 | 8/1985 | Copeland et al. | 250/551 |
| 4,760,249 | 7/1988 | Baskett | 250/213 A |
| 4,904,858 | 2/1990 | LaMarche | 250/213 A |

OTHER PUBLICATIONS

"Triggerable Semiconductor Lasers and Light-Coupled Logic", by J. A. Copeland, *Journal of Applied Physics*, 51(4), Apr. 1980, pp. 1919–1921.

*Primary Examiner*—David C. Nelms
*Assistant Examiner*—S. Allen
*Attorney, Agent, or Firm*—E. E. Pacher

[57] ABSTRACT

Disclosed are articles and systems that comprise optically communicating logic elements. Exemplarily, a first logic element is a real space transfer logic element having two or more electrical input channels and an optical output channel, and a second logic element has two or more electrical input channels and an optical or an electrical output channel. Associated with at least one of the electrical input channels of the second element are means ("switching means") whose electrical state is responsive to an optical signal that impinges on the switching means (e.g., a photoconductor, phototransistor or photodiode). The elements are arranged such that the output signal of the first element impinges on the switching means, whereby the output of the second element is responsive to the output of the first element. In an exemplary embodiment the inventive article comprises massively parallel signal processing means comprising a multiplicity of optically communicating levels.

12 Claims, 2 Drawing Sheets

ARTICLES AND SYSTEMS COMPRISING OPTICALLY COMMUNICATING LOGIC ELEMENTS INCLUDING AN ELECTRO-OPTICAL LOGIC ELEMENT

FIELD OF THE INVENTION

This invention pertains to apparatus that comprises optically communicating logic devices, subsystems or systems.

BACKGROUND OF THE INVENTION

Optical communication between electronic systems and/or subsystems (collectively "assemblies") is well known. See, for instance, U.S. Pat. No. 4,533,833. Conventionally, an electrical output from a first assembly (e.g., a circuit board) is used to modulate the optical output of a LED or laser, and the modulated output is detected by appropriate means (e.g., a PIN photodetector) on a second assembly, with the electrical output of the detector providing an input for the second assembly.

It has previously been proposed (*Journal of Applied Physics*, Vol. 51(4), pp. 1919–1921) that photodiodes and a particular semiconductor laser ("trap-doped" laser) could be interconnected to provide, in one configuration, the logic AND function, and in another configuration, the logic OR function. A laser having two (or more) independently addressable "loss" sections is disclosed in co-assigned U.S. patent application Ser. No. 407,608, filed Sep. 9, 1989 for K. Berthold et al. This laser can serve as a logic element that has electrical inputs and an optical output. The laser can, for instance, provide the logic AND function.

Co-assigned U.S. patent application Ser. No. 07/601,477, filed Oct. 19, 1990 for S. Luryi (incorporated herein by reference) discloses a real-space-transfer light emitting device that can be embodied in a logic element that has electrical inputs and an optical output. The device can provide novel and useful functions. For instance, depending on the input to a control terminal the device can provide logic OR or logic NAND. Logic elements that have electrical inputs and an optical output will herein be referred to as "electro-optical" (E/O) logic elements.

E/O logic elements are expected to find use in a variety of applications, e.g., in optical communications or data processing. In general, articles or systems that utilize logic elements will contain a multiplicity of such elements, with the input of one or more of the elements being responsive to the output of another of the elements. One or more of the logic elements can be a E/O logic element. Such articles or systems desirably would contain features that facilitate communication between an E/O logic element and another logic element (including another E/O logic element). Desirably such features are simple and inexpensive, and do not introduce significant time delay. This application discloses such features, and apparatus that comprises a E/O logic element that is optically interconnected with another logic element.

GLOSSARY AND DEFINITIONS

A "logic element" herein is a circuit element that has at least two input channels and an output channel. Thus, an inverter (whose output is the logical inverse of its input) and a buffer (whose output is the logical equal of its input) are not logic elements as defined herein. The logic element accepts input signals, performs a predetermined transformation on the input signals and presents the resulting output signal in the output channel. Logic elements with two input channels are AND, OR, NAND, NOR, EXCLUSIVE-NOR and EXCLUSIVE-OR elements. Logic elements with more than two input channels provide at least one of the above logic functions if all but two of their input terminals are clamped at a fixed voltage.

A logic element is a "single-device" logic element if it contains one, and only one, active device, i.e., if the active portion of the element is not reducible into two or more separate active devices. A logic element that comprises two or more of transistors, diodes, lasers, LEDs etc. thus is not a "single-device" logic element.

A "light emitting" device herein is a device that emits electromagnetic radiation in response to an electrical input, with the wavelength of the radiation not necessarily being in the visible region of the spectrum.

THE INVENTION

Figure 1:
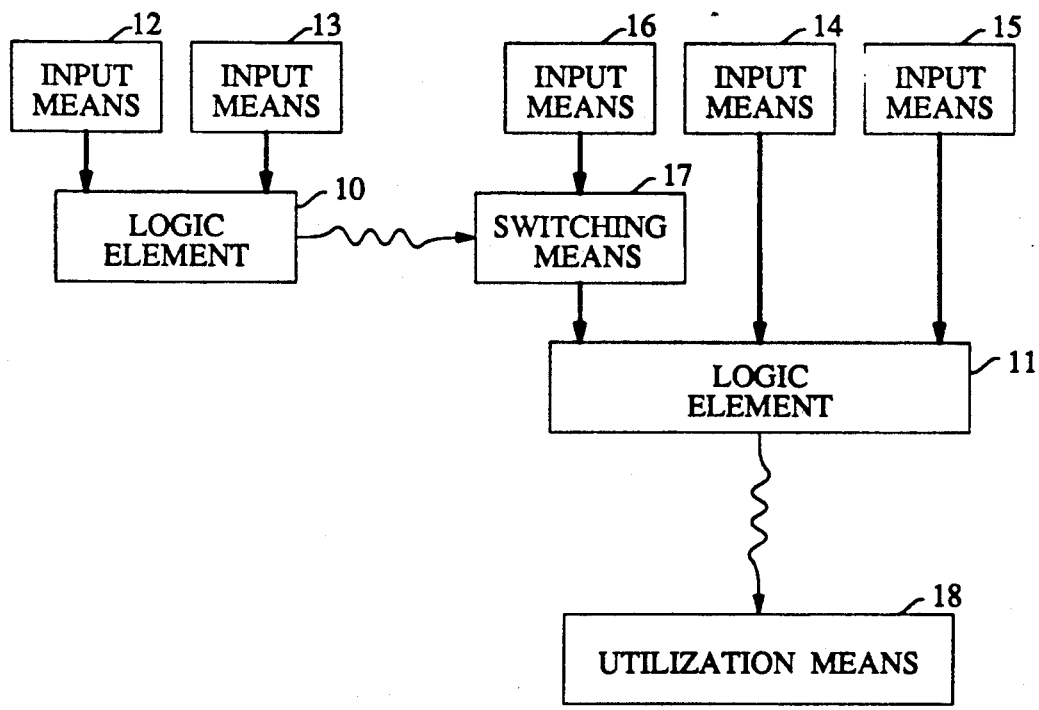
FIG. 1 schematically depicts the relevant portion of an exemplary logic circuit according to the invention.

In a broad aspect the invention is apparatus or an assembly that comprises at least two logic elements, at least one of which is an E/O logic element, (preferably a single-device E/O logic element) and that further comprises means that are adapted for causing the input signal to at least one of the input channels of the other logic element to be a function of the output signal of the E/O logic element.

More specifically, the invention typically is embodied in an article that comprises at least a first and a second logic element. Associated with each of these logic elements is a multiplicity of input channel means that are adapted for receiving electrical input signals, and output channel means adapted for providing an output signal that is responsive to the input signals. At least the first logic element is a E/O logic element. The article further comprises means for providing electrical input signals to the input channel means of the first logic element, means responsive to the output signal of the second logic element, and means adapted for causing the (electrical) input signal to at least one of the input channel means of the second logic element to be a function of the (optical) output signal of the first logic element.

Significantly, the latter means comprise means (herein to be referred to as "switching" means) whose electrical state is responsive to the optical output signal of the first logic element. The switching means thus determine at least one of the electrical inputs to the second logic element. The switching means are located such that at least a part of the optical output signal of the first logic element can impinge on the switching means. Logically, the switching means represent an element (or elements) whose electrical output is an inverter or buffer function of the optical input. Such elements are well known. Exemplarily they comprise a photoconductor, a phototransistor, or a composite element comprising at least one photodetector integrated with one or more transistors.

In currently preferred embodiments of the invention at least the first logic element is a single-device logic element, exemplarily a real space transfer light emitting semiconductor device, preferably a real space transfer vertical cavity surface emitting laser. Such real space transfer light emitting logic devices can have two or three (in principle even more than three) input channels. Exemplarily, the article according to the invention comprises at least two substrate means, with the first logic element positioned on one of the two substrate means, and the second logic element positioned on the other of the two substrate means. In another exemplary embodiment the two logic elements are mounted on (or or made in) opposite sides of the same substrate such that optical communication can take place through the substrate. The substrate thus is either substantially transparent for the output radiation of the first logic element, or comprises an appropriately positioned aperture.

FIG. 1 schematically shows the relevant portion of exemplary apparatus according to the invention. Numerals 10 and 11 refer to the first and second logic elements, respectively, 12–16 to means for providing electrical input to the two logic elements, 17 to the switching means, and 18 to the means that are responsive to the output of the second logic element. Exemplarily, 12–15 comprise conventional logic elements, and 16 is a constant voltage source. The electrical state of the input channel that is associated with input means 16 is a function of the state of the output channel of 10, and thus of the electrical states of the input channels associated with 12 and 13. It will be appreciated that logic element 10 could have more than two inputs, and that 11 could be a conventional logic element, and/or could have only two inputs.

Figure 2:
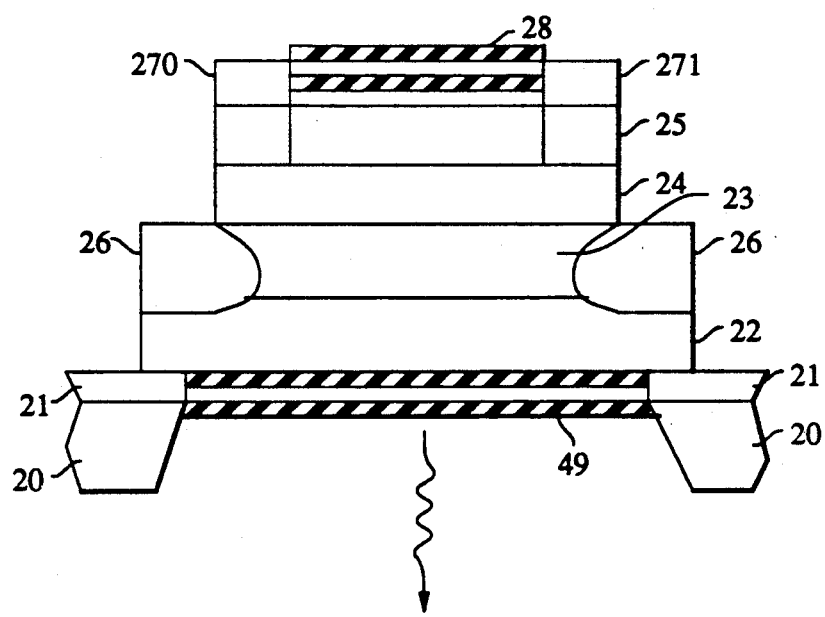
FIG. 2 shows schematically a real space transfer vertical cavity surface emitting laser that can be used in the practice of the invention.

FIG. 2 schematically depicts a vertical cavity surface emitting laser (VCSEL) that is useful in the practice of the invention. The laser is a real-space transfer device and is fully described in the previously referred to '477 patent application. On InP substrate 20 is etch stop layer 21 (e.g., p-type InGaAs) which is followed by p-InP collector 22, p InGaAs active region 23, undoped InP barrier 24, and n InGaAs emitter 25. Lateral confinement of injected electrons in the active region is provided by p+ region 26, which exemplarily is doped by ion implantation. The collector contact (not shown) can be placed on the back of the wafer if a p-type substrate is used. This would permit the use of a common collector for an array of VCSEL devices. If system considerations require the use of a semi-insulating substrate, then layer 22 should be understood as a thick (more than 1 micron) highly conducting p-type InP layer, epitaxially grown on the substrate and contacted on the side of the SEL. Numerals 270 and 271 refer to the emitter contacts, and 28 and 29 refer to dielectric mirrors, exemplarily each consisting of a multiplicity of $Si/SiO_2$ layer pairs, with each layer having $\lambda/4$ optical thickness. Such mirrors are known and can have very high (>99%) reflectivity. The wavy arrow in FIG. 2 indicates the optical output channel. It will be appreciated that the output channel can pass through either, or even both, of the dielectric mirrors. In the latter case, the device can have an optical fan-out of 2, with output signal possibly impinging on two separate and independent switching and/or responsive means, simultaneously or with a pre-determined propagation delay.

Figure 3:
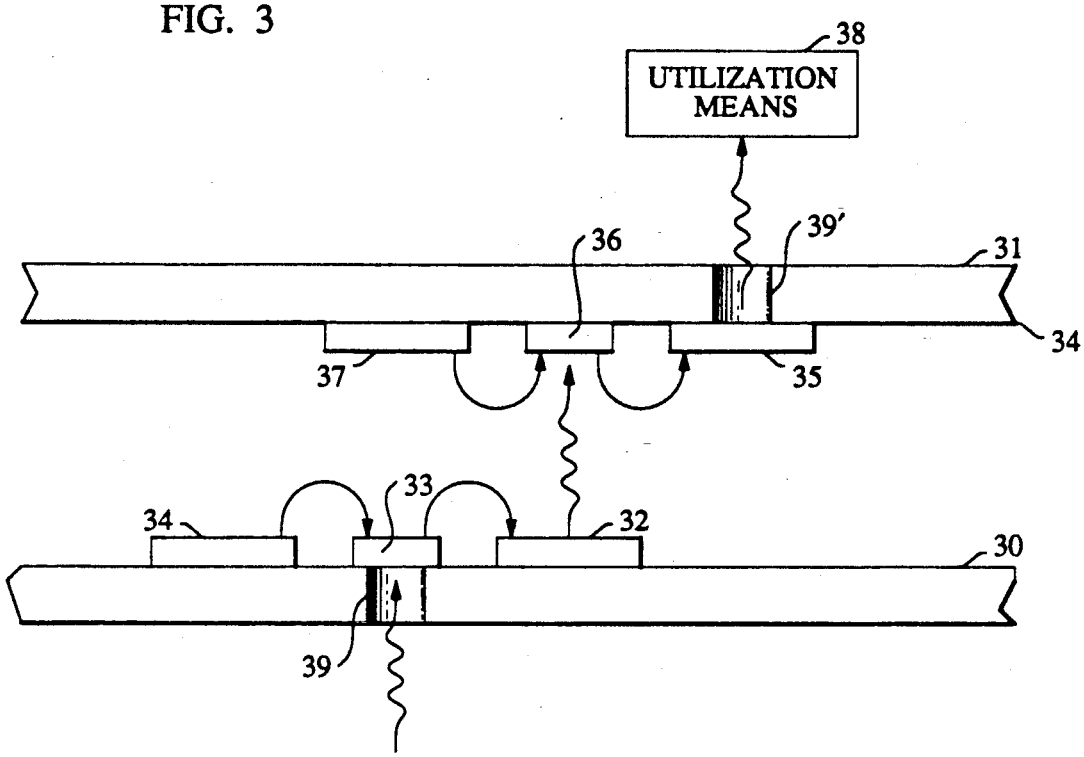
FIGS. 3 and 4 schematically depict relevant portions of exemplary articles according to the invention.
Figure 4:
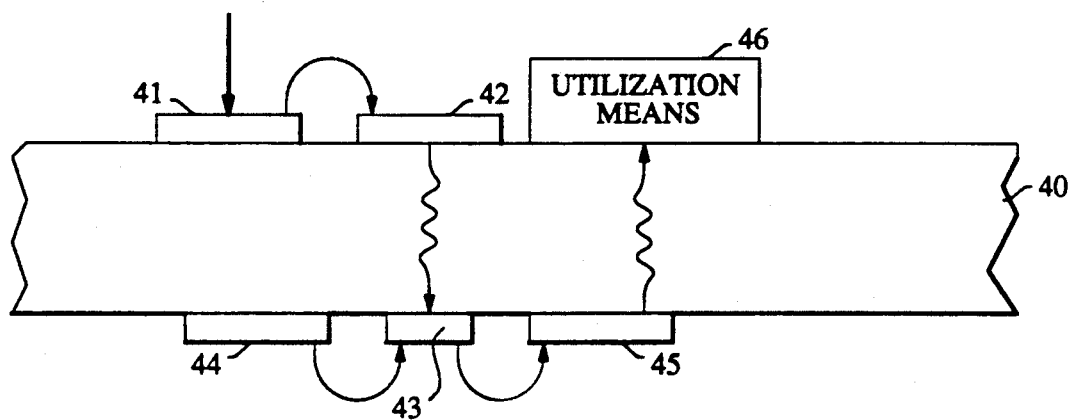

FIG. 3 schematically shows the relevant portion of an exemplary article according to the invention, wherein numerals 30 and 31 refer to first and second substrate means, respectively. On substrate 30 are mounted input means 34, switching means 33, and E/O logic element 32. Electrical inter-connection between these elements typically will be by means of "thick film" or "thin film" conductors formed on 30. However, for clarity's sake schematic wire connections are shown in FIGS. 3 and 4. Aperture 39 permits passage of an optical signal (from external means not shown) to 33, whereby the electrical state of an input channel of 32 can be responsive to the external means, and, consequently, the output of 32 can be responsive to the same external means. The optical output of 32 impinges on switching means 36 which are electrically to input means 37 and E/O logic element 35. The output of 35 passes through aperture 39' and impinges on utilization means 38. It will be understood that apertures (e.g., 39) can, if desired, be back-filled with material that is substantially transparent for radiation of the relevant wavelength.

The relevant portion of a further article according to the invention is schematically shown in FIG. 4, wherein numeral 40 refers to substrate means that are substantially transparent for the output radiation of E/O logic elements 42 and 45. By "substantially transparent" we mean that an effective amount (e.g., more than 1%) of the incident optical signal radiation is transmitted through the substrate means. Exemplarily 40 is a semiconductor (e.g., Si) wafer. Input means 41 (e.g., a conventional logic element that is responsive to an electrical signal from external means that are not shown) are connected to 42. Switching means 43 receive output radiation from 42. Numeral 44 refers to input means, e.g., a constant voltage source. Utilization means 46 receive radiation emitted by 45. It will be appreciated that, for reasons of clarity, only one input channel is shown for a given logic element. Those skilled in the art will also appreciate that through-the-substrate communication of FIG. 4 can be combined with inter-substrate communication of FIG. 3, and that many variations of the basic schemes are possible.

For instance, and preferably, the various components shown in FIG. 4 are monolithically integrated on the substrate, analogous to VLSI chips. Such assemblies can be produced by epitaxial growth on both sides of an appropriate semiconductor (e.g., InP) substrate, followed by lithographic processing, metallization, etc. Alignment of complementary structures on opposite sides of the wafer can be assured with the aid of an infrared microscope. Epitaxial growth (including strained layer epitaxial growth, e.g., GaAs/Si) can be simultaneously on both sides of the wafer (e.g., by MOCVD), or sequentially (e.g., by MBE).

It will be appreciated that the schemes schematically shown in FIGS. 3 and 4 can be extended by "stacking" n (n>2) substrates. For instance, we exemplarily envisage massively parallel (e.g., more than 100 parallel processing paths) data processing apparatus according to the invention wherein each of N (N≧n) "levels" of such a stack contains a multiplicity of logic "cells". By a logic cell we mean a processing unit comprising one or more logic elements that carry out a predetermined logic transformation on two or more input signals. The cells on a given level of the stack generally do not have logic interactions with each other, but the possibility of such interaction is not excluded. A given cell receives optical input from the corresponding E/O logic element on the adjacent "lower" level, performs one or more logic operations that determine the output of an E/O logic element in the cell, and the optical output of the E/O logic element provides the optical input of the corresponding cell on the adjacent "upper" level. Each level thus processes in parallel many streams of information from the previous layer.

As technology continues to progress towards smaller and smaller feature sizes in electronic (and also many optical and E/O) devices, and since, as a consequence, the number of devices on a single chip continues to grow, the problem of providing the required number of input and output channels to a chip is becoming more and more severe. As is well known, conventionally input and output contacts are located around the periphery of a chip. Not only is such an approach relatively wasteful of chip surface area but the frequently required relatively long conductors tend to introduce undesirable propagation delays. Finally, designers are finding it increasingly difficult to accommodate the ever increasing number of input/output contacts around the chip periphery, and to route increasing numbers of conductor lines from the interior of the chip to the periphery.

Prior art approaches (exemplified by the previously cited '833 patent) typically used LEDs, lasers and photodetectors that can, at least in principle, be placed anywhere on a chip. These devices of course do not perform logic. They introduce delay that is unrelated to the logic function carried out by the assembly.

In articles according to the invention the above referred-to shortcomings are alleviated or even eliminated, since the output of E/O logic elements not only can be made available at any point on the surface of a chip but the E/O elements also perform logic, thus reducing delay. These features of the invention can result in improved inter-chip communications and are considered to be important aspects of the invention.

EXAMPLE

On a InP wafer is formed a E/O logic element (a VCSEL of the type shown in FIG. 2) with two input channels. Contacts are provided such that electrical bias can be applied to the device. The optical output of the device has 1.55 μm wavelength, and corresponds to the EXCLUSIVE-OR truth table.

On a conventional circuit board are mounted a PIN diode that is responsive to 1.55 μm radiation and that is reverse biased (3V), with a load resistor between p-side and ground. The resistor is chosen such that its resistance is much less than the back-resistance of the diode and less than the resistance of the illuminated diode, such that the p-side terminal of the diode experiences a 2-V swing between the illuminated and the "dark" state. On the circuit board is also mounted a conventional AND logic element, with one of the input terminals connected to the p-side terminal of the diode and the other input terminal connected to a 3V dc source. The circuit board is placed such that the output radiation of the E/O logic element impinges on the PIN diode. When both inputs of the E/O element are either high or low (1 or 0), the variable input of the AND element is about 3V and the output of the AND element is high (logic 1). When one of the inputs of the E/O element is high and the other is low, the variable input of the AND element is about 1 volt and the output of the AND element is low (logic 0).

I claim:
1. An article comprising
   a) at least a first and second logic element, associated with each of said two logic elements being a multiplicity of input channel means adapted for receiving electrical input signals and output channel means adapted for providing an output signal responsive to the input signals;
   b) means for providing electrical input signals to the input channel means of the first logic element;
   c) means responsive to the output signal of the second logic element; and
   d) means adapted for causing the input signal to at least one of the input channel means of the second logic element to be a function of the output signal of the first logic element;
   characterized in that
   e) the output singal of at least the first logic element is an optical signal; and
   f) the means of d) comprise first means whose electrical state is responsive to an optical signal that impinges on the first means, and the first means are located such that at least a part of the optical output signal of the first logic element can impinge on the first means.

2. The article of claim 1, wherein at least the first logic element is a single device logic element.

3. The article of claim 2, wherein the single device logic element comprises a real space transfer light emitting semiconductor device.

4. The article of claim 3, wherein said real space transfer device comprises three input terminal means.

5. The article of claim 1, wherein the means whose electrical state is responsive to an optical signal comprise a photoconductor, photodiode or phototransistor.

6. The article of claim 1, wherein the article comprises at least two substrate means with the first logic element positioned on one of the substrate means and the second logic element positioned on the other substrate means.

7. The article of claim 6, wherein at least the first logic element is a real space transfer verticle cavity surface emitting laser.

8. The article of claim 1, wherein the article comprises a substrate means having two major surfaces, with the first logic element disposed on one of the major surfaces and the second logic element and the first means disposed on the other major surface.

9. The article of claim 1, wherein the article comprises a semiconductor body having two substantially parallel major surfaces, with the first and second logic elements extending into the semiconductor body from one and the other of the major surfaces, respectively.

10. The article of claim 9, wherein the semiconductor body is substantially transparent for the optical signal.

11. The article of claim 2, wherein the article comprises a first and second multi-device assembly, associated with each of the first and second multi-device assemblies being a periphery and a center, the first and second multi-device assembly comprising the first and second logic elements, respectively, and each of the first and second logic elements being located closer to the center of the respective multi-device assembly than to the periphery thereof.

12. An article comprising massively parallel signal processing means comprising n (n>2) semiconductor bodies disposed such as to form a "stack" of semiconductor bodies;

a) each body comprising a multiplicity of logic "cells", the cells arranged in N (N>n) processing levels including an input level and an output level, and further arranged such that a cell on a given level can receive an opticle input signal from a cell on a level closer to the input level than the given level, and/or can provide an input signal to a cell on a level closer to the output than the given level;

b) each logic cell comprising one or more logic elements, with each logic element having a multiplicity of input channels adapted for receiving electrical input signals and an output channel for providing an output signal that is responsive to the input signals;

c) the article further comprising means for providing input signals for at least some of the logic cells on the input level, and means responsive to the output signals from at least some of the cells on the output level; wherein d) the output signals of at least some of the logic elements are optical signals; and e) associated with at least some of the logic elements are first means whose electrical state is responsive to an optical signal that impinges on the first means, the optical signal that impinges on the first means associated with a second logic element being an output signal of a first logic element that belongs to a cell that is closer to the input level than the second logic element, such that the input signal to at least one of the input channels of the second logic element is a function of the output signal of the first logic element.

* * * * *